United States Patent [19]

Haight

[11] Patent Number: 5,198,747

[45] Date of Patent: Mar. 30, 1993

[54] LIQUID CRYSTAL DISPLAY DRIVER AND DRIVER METHOD

[75] Inventor: Michael H. Haight, Pottsboro, Tex.

[73] Assignee: Texas Instruments Incorporated, Dallas, Tex.

[21] Appl. No.: 517,989

[22] Filed: May 2, 1990

[51] Int. Cl.[5] .............................................. G05F 5/08
[52] U.S. Cl. .................................... 323/303; 307/491;
323/354; 340/784
[58] Field of Search ............ 307/310, 475, 491, 296.1,
307/296.6, 296.7; 359/85; 323/280, 281, 303,
354; 340/784

[56] References Cited

U.S. PATENT DOCUMENTS

| | | | |
|---|---|---|---|
| 4,396,883 | 8/1983 | Holloway et al. | 323/313 |
| 4,797,577 | 1/1989 | Hing | 323/281 |
| 4,808,908 | 2/1989 | Lewis et al. | 323/313 |
| 4,810,948 | 3/1989 | Takuma | 323/280 |

FOREIGN PATENT DOCUMENTS

| | | | |
|---|---|---|---|
| 17414 | 2/1981 | Japan | 340/784 |
| 188120 | 8/1988 | Japan | 340/784 |

*Primary Examiner*—William H. Beha, Jr.
*Attorney, Agent, or Firm*—B. Peter Barndt; Robby T. Holland; Richard L. Donaldson

[57] ABSTRACT

An LCD drive circuit includes a voltage divider circuitry which generates a plurality of voltages ($V_1$–$V_5$) in response to a reference voltage. A substantially constant reference voltage is generated by a band-gap reference circuit (22). A digital-to-analog converter (32) allows the voltages to be adjusted responsive to digital control signals.

19 Claims, 4 Drawing Sheets

LEVEL CHANGE

LIQUID CRYSTAL DISPLAY DRIVER AND DRIVER METHOD

TECHNICAL FIELD OF THE INVENTION

This invention relates in general to integrated circuits and more particularly to liquid crystal display drivers.

BACKGROUND OF THE INVENTION

Liquid crystal displays (LCDs) respond to the RMS value a square wave voltage signal applied to the LCD. The input voltage necessary to drive the LCD are selected according to the turn-on and turn-off voltages of the LCD material and the duty cycle of the square wave. Typically, five or six greater or lesser number of voltages could be used, depending on the duty cycle.

In the prior art, an integrated driving circuit is used to drive the LCDs. The five voltages are generated external to the driving circuit via a supply voltage and a resistor ladder which divides the supply voltage into the desired five voltages.

In many cases, the supply voltage is a battery, which has an output which will vary over the life of the battery. The output level of the supply voltage will affect the contrast of the LCD; hence, a potentiometer is often used to trim the generated voltages input to the driver circuit. Consequently, to maintain a constant contrast, the potentiometer would necessarily be adjusted throughout the life of the battery, which is inappropriate in many circumstances. Further, the contrast of the LCD will vary with temperature, which also complicates the goal of a constant contrast.

Therefore, a need has arisen in the industry for a circuit which is operable to drive an LCD at a substantially constant contrast over a normal operating temperature range and over the life of a battery. Further, it is desirable that the entire LCD driver circuit be integrated such that the driving voltages are generated on the integrated circuit, in order to simplify design.

SUMMARY OF THE INVENTION

In accordance with the present invention, a circuit for generating a plurality of driving voltages for use with a LCD driver circuit is provided which substantially eliminates problems associated with prior art circuits.

In the present invention, a circuit for generating a plurality of driving voltages for use with a LCD driver circuit includes a voltage source, a reference voltage source coupled to the voltage source for outputting a substantially constant reference voltage despite variations in the voltage output from the voltage source and a voltage divider circuit for generating a plurality of driving voltages responsive to the reference voltage.

In one aspect of the present invention, the reference voltage source comprises a band-gap voltage source. This aspect of the invention provides the advantage that the reference voltage is substantially constant over variations in the voltage output from the voltage source, but may vary with regards to temperature in order to compensate for the LCD's voltage needs.

BRIEF DESCRIPTION OF THE DRAWINGS

For a more complete understanding of the present invention and the advantages thereof, reference is now made to the following descriptions taken in conjunction with the accompanying drawings in which.

DETAILED DESCRIPTION OF THE INVENTION

The preferred embodiment of the present invention is best understood by referring to FIGS. 1-7 of the drawings, like numerals being used for like and corresponding parts of the various drawings.

Figure 1:
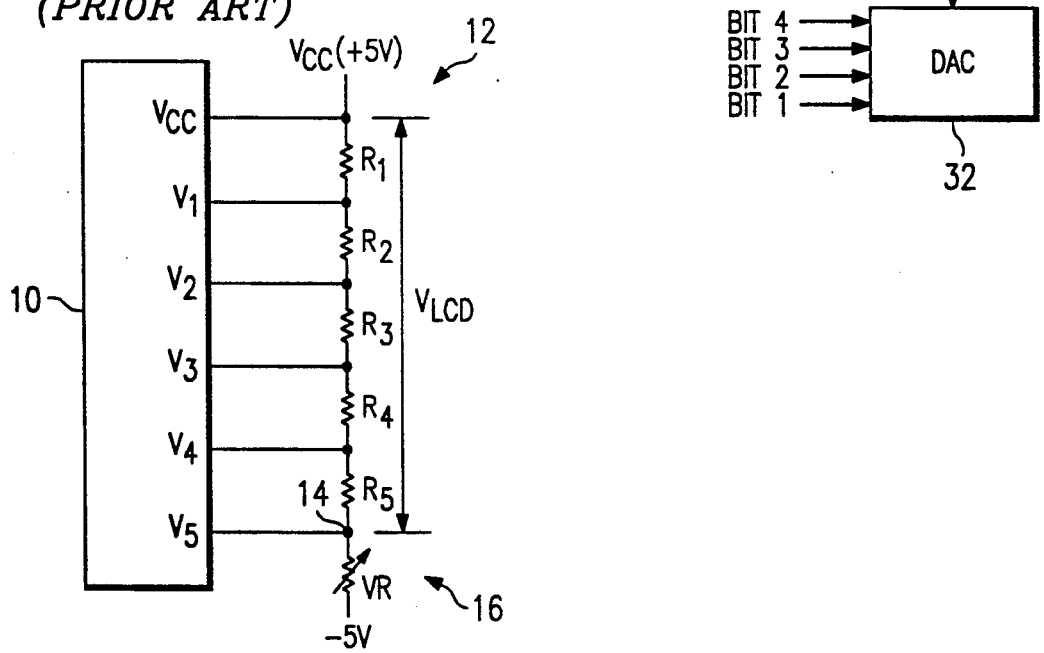
FIG. 1 represents a schematic view of a prior art voltage divider circuit.

FIG. 1 illustrates a circuit typically used for generating the voltages required for an LCD (Liquid Crystal Display). A voltage driver circuit 10 receives six voltages ($V_{cc}$ and $V_1$-$V_5$) from a voltage divider circuit 12. The voltage divider circuit comprises a plurality of resistors ($R_1$-$R_5$) connected between $V_{cc}$ and a voltage node 14. The voltage node 14 is connected to a variable voltage source 16. Typically, the variable voltage source 16 comprises a potentiometer connected between the voltage node 14 and a predetermined voltage, shown in FIG. 1 as $-5$ volts. The variable voltage source 16 allows the user to adjust the voltage across the resistors $R_1$-$R_5$, thereby affecting the voltage's input to the voltage driver circuit 10, and consequently, affecting the contrast of the LCD. The voltage driver circuit 10 performs proper multiplex switching to drive the LCD.

This circuit has significant problems associated with it. Since the voltage divider circuit 12 is not provided on the voltage driver circuit, it is left to the system level designer to design a circuit to produce the drive voltages externally. Further, since $V_{cc}$ may not be stable, the variable voltage source must be used to adjust the contrast of the LCD to a comfortable level. When $V_{cc}$ is provided from a battery source, for example, the voltage level will decrease over time, requiring adjustment. In many devices, such as handheld electronic games, it is not desirable to have an external contrast control. Also, the ambient temperature will affect the contrast of the LCD display, also requiring an adjustment of the variable voltage source.

Figure 2:
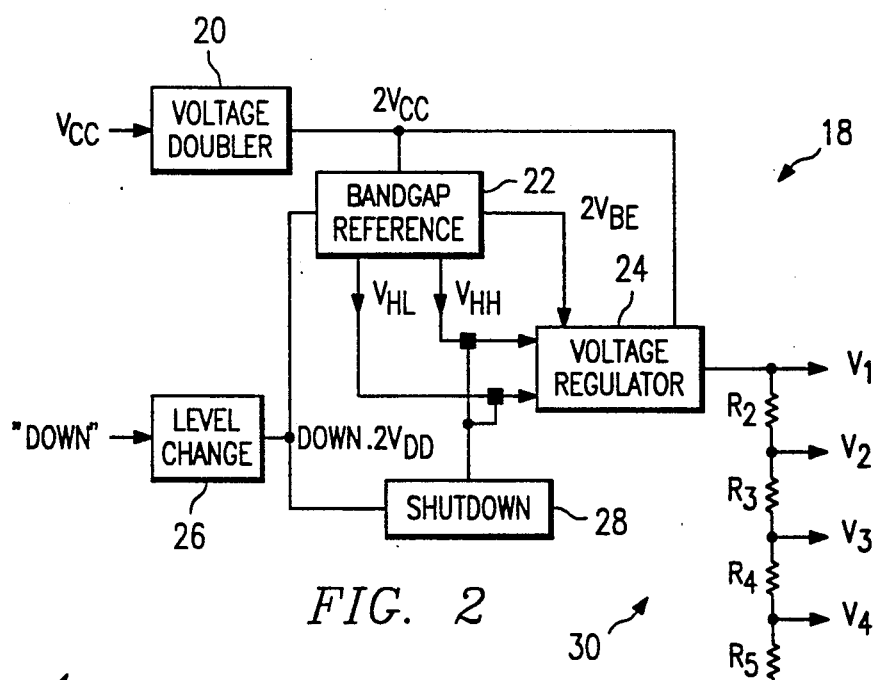
FIG. 2 illustrates a block diagram of the present invention.

FIG. 2 illustrates a block diagram of the present invention. The present invention is designed for integration with other circuits including the circuit for proper multiplex switching on a single integrated circuit, thereby alleviating a need for a separate voltage divider circuit. Voltage driver circuitry, similar to circuit 10, would be used in conjunction with the voltage divider circuitry 18 shown in FIG. 2. A voltage doubler 20 is connected to $V_{cc}$. The output of the voltage doubler is equal to a voltage level of $2*V_{cc}$. This voltage is connected to a band-gap reference circuit 22 and a voltage regulator 24. A level change circuit 26 is connected to a DOWN signal. The output of the level change circuit 26 is connected to the band-gap reference circuit 22 and a shut-down circuit 28. The band-gap reference voltage outputs three voltage levels; (1) $2V_{BE}$, (2) $V_{HH}$ and (3)

$V_{HL}$. All three voltages are coupled to the voltage regulator 24, along with the $2V_{cc}$ voltage level from the voltage doubler 20. The output of the voltage regulator 24 is shown as $V_1$. A resistor ladder 30, comprising resistors $R_2-R_5$ is connected between the voltage regulator 24 and a digital-to-analog converter (DAC) 32. Four digital inputs, BIT1-BIT4 are coupled to the DAC 32.

In operation, the voltage doubler 20 doubles $V_{cc}$, which in a battery operated circuit may vary a great deal. The voltage doubler will typically require two external capacitive components. The doubled voltage supply powers the band-gap reference circuit 22, which develops a nearly constant voltage of twice a base/emitter voltage plus two other voltages ($V_{HL}$ and $V_{HH}$), which nearly track the supply voltage, but whose value with respect to the supply voltage is dependent upon the size (and hence, strength) of the transistors used in the band-gap reference circuit 22. The larger the transistors (N- and P-channel devices), the lesser the voltage between $2 V_{CC}$ and $V_{HH}$ or $V_{HL}$. These voltages are useful for generating currents (for current mirrors) independent of the process parameters or transistor characteristics.

The band-gap reference 22 outputs constant reference voltages, despite variations in voltage from the voltage doubler 20 caused by an non-constant supply voltage ($V_{cc}$). The band-gap reference 22 may also be designed such that the output is slightly varied in response to temperature changes. The band-gap reference circuit is discussed in greater detail in connection with FIGS. 3-6.

The voltage regulator 24 produces the output voltage $V_1$ based on the outputs from the band-gap reference circuit 22. Incoming signals $V_{HH}$ and $V_{HL}$ set currents internal to the voltage regulator 24. The DAC 32 produces a voltage in response to the signals on the four logic level input nodes (BIT1-BIT4). The DAC 32 eliminates the reliability problems of a mechanical type variable resistor, and further, may be entirely integrated on an integrated circuit being controlled by a logic source that may use existing switches on the end product to perform a dual role.

The resistor string $R_2$, $R_3$, $R_4$ and $R_5$ divide the voltage regulator output ($V_1$) into five voltages. The five voltages ($V_1-V_5$) are switched through transmission gate driver logic, similar to that used in voltage driver circuit 10.

Figure 3:
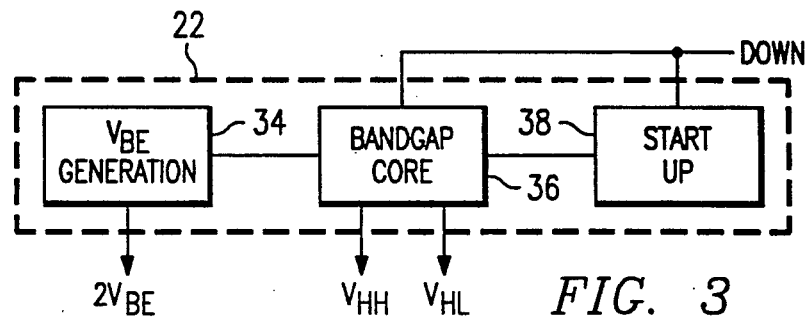
FIG. 3 illustrates a block diagram of the band-gap reference circuit illustrated in FIG. 2.

FIG. 3 illustrates a block diagram of the band-gap reference circuit 22. The band-gap reference circuit 22 comprises three functional components: A $V_{BE}$ generation circuit 34, a band-gap core circuit 36, and a start-up circuit 38. A DOWN signal is input to the band-gap core circuit 36 and the start-up circuit 38. The band-gap core circuit 36 outputs two voltages, $V_{HH}$ and $V_{HL}$, and the $V_{BE}$ generation circuit 34 outputs a voltage of $2V_{BE}$.

The DOWN signal controls the operation a standby/no current flow mode in the band-gap reference circuit 22. When the DOWN signal is a logic high, power is denied to the entire band-gap reference circuit. When the DOWN signal changes from a logic high to a logic low, the start-up circuit 38 provides signals to the band-gap core circuit 36 to cause proper transition of the $V_{HH}$ and the $V_{HL}$ signals.

Figure 4:
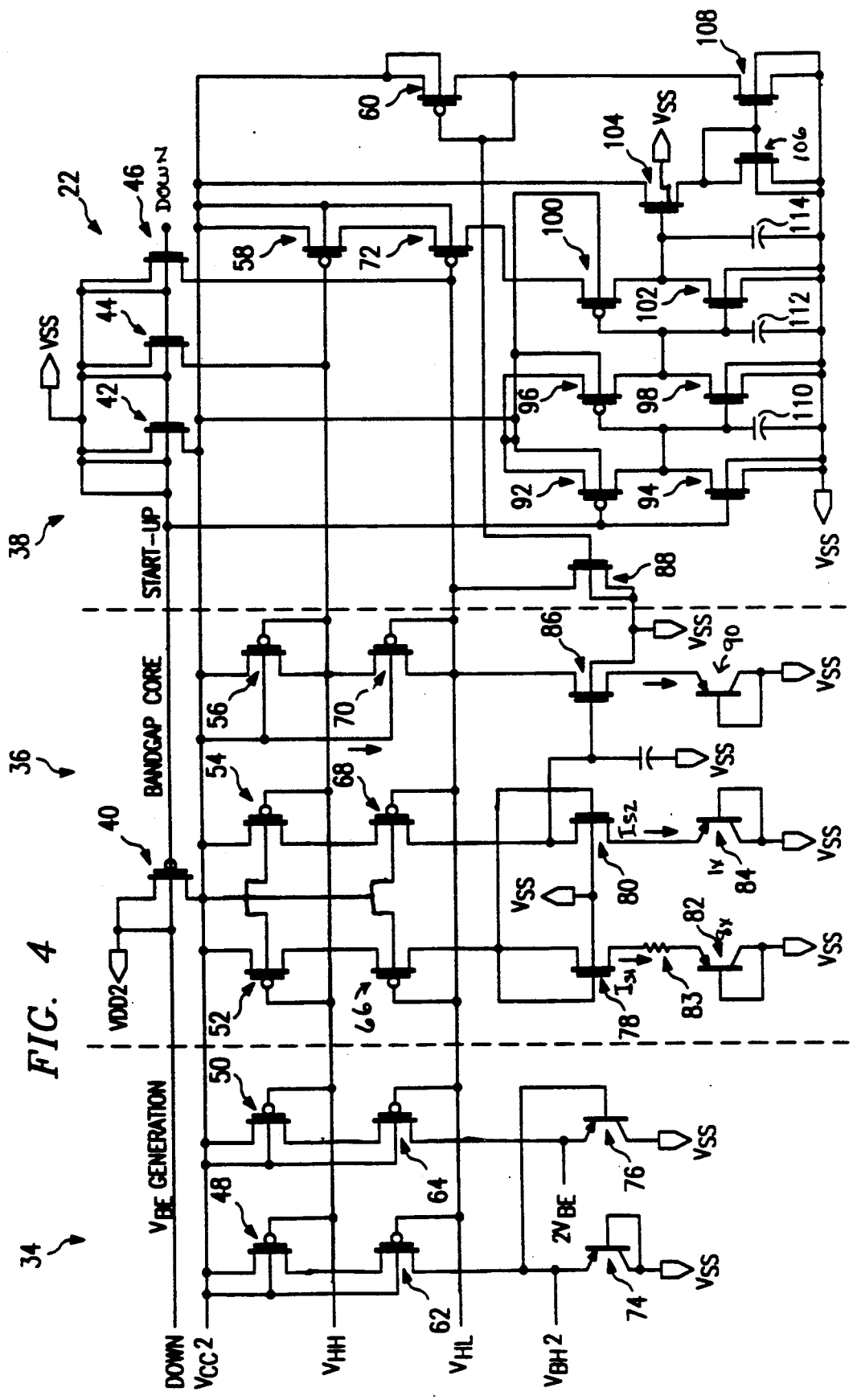
FIG. 4 illustrates a schematic representation of the band-gap reference circuit of FIG. 3.

FIG. 4 illustrates a circuit diagram of the band-gap reference circuit 22. The DOWN signal is connected to the gates of P-channel transistor 40 and N-channel transistors 42, 44 and 46. $V_{DD}2$ is connected to a source of the transistor 40. The source of N-channel transistors 42, 44 and 46 are connected to $V_{SS}$; the drain of N-channel transistor 42 is connected to the signal $V_{CC}2$ (which is the output from the voltage doubler circuit 22), the drain of N-channel transistor 44 is connected to $V_{HL}$ and the drain of N-channel transistor 46 is connected $V_{HL}$. $V_{CC}2$ is connected to a first source/drain of P-channel transistors 48, 50, 52, 54, 56, 58 and 60. The gates of P-channel transistors 48, 50, 52, 54, 56 and 58 are connected to $V_{HH}$. $V_{HL}$ is connected to the gates of P-channel transistors 62, 64, 66, 68, 70 and 72. The drain of transistor 48 is connected to the source of transistor 62. The drain of transistor 50 is connected to the source of transistor 64. The drain of transistor 54 is connected to the source of transistor 68. The drain of transistor 56 is connected to the source of transistor 70 and to $V_{HH}$. The drain of transistor 58 is connected to the source of transistor 72. The drain of P-channel transistor 62 is connected to the emitter of PNP transistor 74. The drain of P-channel transistor 64 is connected to the emitter of PNP transistor 76. The base and collector of PNP transistor 74 are connected to $V_{SS}$ along with the collector of PNP transistor 76. The base of PNP transistor 76 is connected to the emitter of PNP transistor 74. The drain and gate to transistor 78 is connected to the gate of transistor 80 and to the drain of transistor 66. The drain of transistor 80 is connected to the drain of transistor 68 and gate of transistor 86. The source of transistor 78 is connected to the emitter of PNP transistor 82 through resistor 83. The base and collector of transistor 82 are connected to $V_{SS}$. The source of N-channel transistor 80 is connected to the emitter of PNP transistor 84. The base and collector of PNP transistor 84 are connected to $V_{SS}$. N-channel transistors 86 and 88 have drains connected to $V_{HL}$. The source of N-channel transistor 86 is connected to the emitter of PNP transistor 90. The base and collector of PNP transistor 90 are connected to $V_{SS}$. N-channel transistor 88 has a source connected to $V_{SS}$ and a gate connected to the gate of P-channel transistor 60 and the drain of transistor 108. The gates of P-channel transistor 92 and N-channel transistor 94 are connected to the DOWN signal. A source of P-channel transistor 92 is connected to a source of P-channel transistor 96. The gate of P-channel transistor 96 is connected to the drain of P-channel transistor 92 and the drain of N-channel transistor 94. The source of N-channel transistor 94 is connected to $V_{SS}$. The gate of N-channel transistor 98 is connected to the gate of P-channel transistor 96. P-channel transistor 96 and N-channel transistor 98 have drains connected together and to the gates of P-channel transistor 100 and N-channel transistor 102. N-channel transistor 100 has a source connected to the drain of P-channel transistor 72. P-channel transistor 100 has a drain connected to the drain of N-channel transistor 102. The source of N-channel transistor 102 is connected to $V_{SS}$. The gate of N-channel transistor 104 is connected to the node connecting the drains of transistors 100 and 102. The drain of N-channel transistor 104 is connected to $V_{CC}2$. The source of N-channel transistor 104 is connected to the drain and gate of N-channel transistor 106 and to the gate of N-channel transistor 108. The drain of N-channel transistor 108 is connected to the gate and drain of P-channel transistor 60. The source of transistors 106 and 108 are connected to $V_{SS}$. Capacitors 110, 112 and 114 have first terminals connected to $V_{SS}$ and the second terminals connected to the gates of N-channel transistors 98, 102 and 104, respectively.

The DOWN signal controls the operation or standby/no current modes of the band-gap reference circuit 22. When the DOWN signal is a logical high, supply current is denied to the entire band-gap reference circuit 22 via P-channel transistor 40 and the $V_{CC}2$, $V_{HH}$ and $V_{HL}$ signals are held to ground by N-channel transistors 42, 44 and 46, respectively. When the DOWN signal changes from a logical high to a logical low, these three signals are allowed to assume their normal DC positions. However, in this circuit as in most band-gap circuits, this will not occur. Therefore, the start-up circuitry 38 is used to pull the $V_{HL}$ signal down via transistor 88 after the balance of the band-gap has had sufficient time to settle.

The DOWN signal is applied to the input of a three-inverter string comprising transistors 92 and 94, 96 and 98, and 100 and 102. On the output of each inverter of the string, three capacitors are used to provide an overall delayed inversion. The delayed inversion is applied to a current mirror which turns on an N-channel transistor 88 which mildly 30 pulls the signal of $V_{HL}$ in the event that diode connected transistors 56 and 70 have not yet done so.

The $V_{BE}$ generation circuit 34 generates the output signal of $2*V_{BE}(2*V_{BE})$. As will be discussed later, the signals $V_{HH}$ and $V_{HL}$ exhibit a stable performance over supply, process and, to a lesser extent, temperature. Further, while $V_{HH}$ and $V_{HL}$ may vary with supply voltage, the differential voltage, $V_{HL}$, remains substantially constant. While there is some compensation deliberately provided over temperature, most of the compensation is neglected in favor of lower junction potentials at elevated temperatures. Since the dual junction voltage is supplied to a reference node that has a direct effect on the voltage placed across the LCD material, the temperature compensation and the band-gap section 36 may be used to compensate the effect that temperature has on the LCD material itself.

The band-gap core circuitry 36 develops currents used in the $V_{BE}$ generation circuitry 34 and the start-up circuitry 38. The PNP transistor 82 has a size eight times that of PNP transistor 84. The MOS devices 52, 54, 66, 68, 78 and 80 provide matched current sources. Since bipolar transistor 82 has an area eight times larger than the PNP transistor 84, the voltage drop across the PNP transistor 82 will be less when each PNP transistor is receiving the same current ($I_{B1}=I_{B2}$). Resistor 83 makes up for the difference in the base/emitter voltage drop. As the temperature varies, the $V_{CC}$ of each device will change at this proportionate rate due to the different sizes. This allows the circuit to automatically compensate for change in LCD contrast due to temperature variations in cases where the LCD is located close to the driving circuitry.

Figure 5:
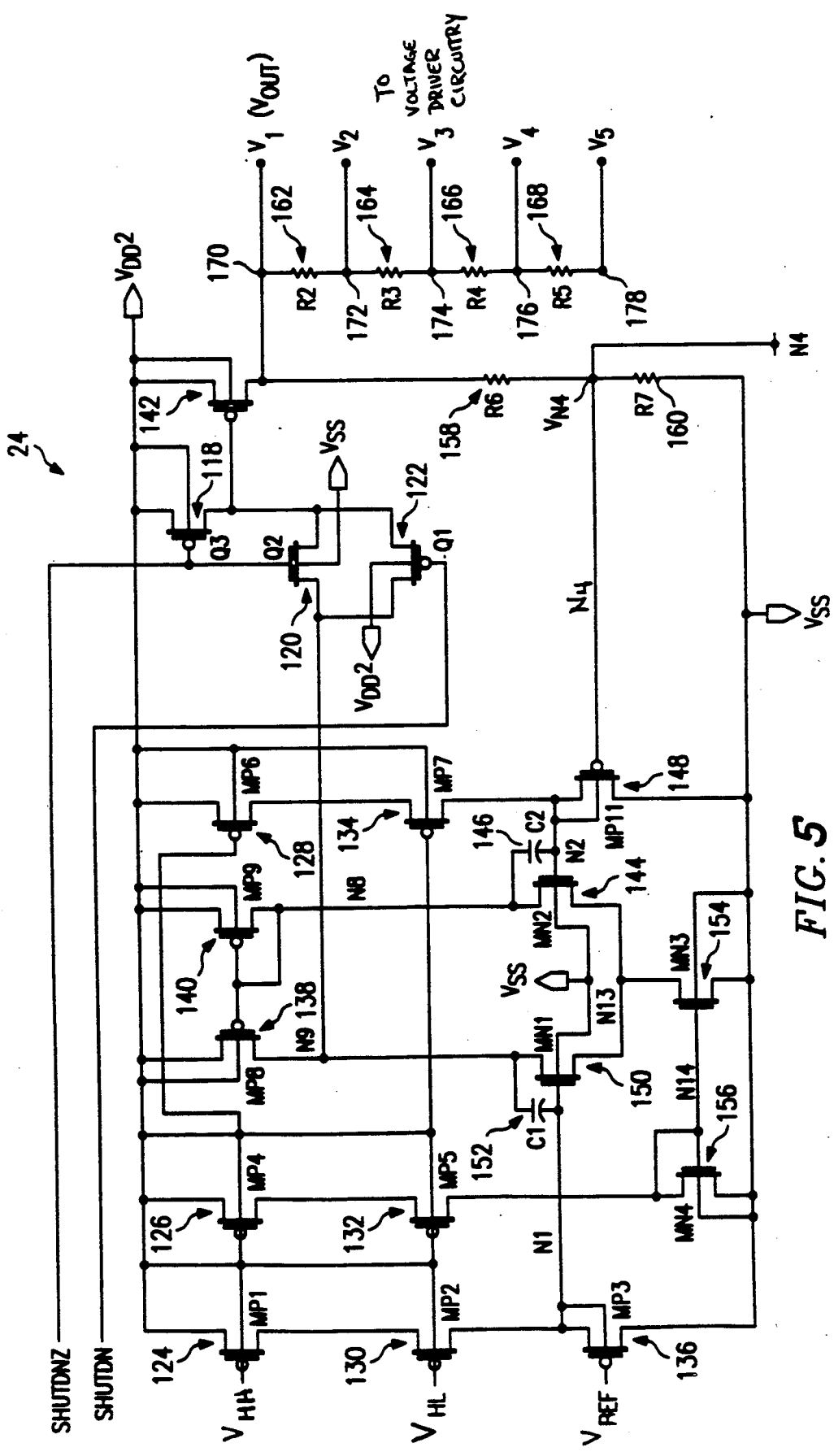
FIG. 5 illustrates a schematic representation of the voltage regulator circuit of FIG. 2.

The voltage regulator circuit 24 is illustrated in FIG. 5. The voltage regulator 24 receives signals, SHUTDN, SHUTDNZ (the logical inversion of SHUTDN), $V_{HH}$, $V_{HL}$, and $V_{ref}$(i.e., $2*V_{BE}$). SHUTDDNZ is connected to the gate of P-channel transistor 118 and N-channel transistor 120. Shutdn is connected to the gate of P-channel transistor 122. $V_{HH}$ is connected to the gates of P-channel transistors 124, 126, and 128. $V_{HL}$ is connected to the gates of P-channel transistors 130, 132 and 134. $V_{ref}$ is connected to the gate of P-channel transistor 136. A source of P-channel transistors 124, 126, 5, 138, 140, 128, 118 and 142 are connected to VDD2 ($2*V_{DD}$).

The drain of P-channel transistor 124 is connected to the source of P-channel transistor 130. The drain of transistor 126 is connected to the source of transistor 132. The drain of transistor 128 is connected to the source of transistor 134. The drain of transistor 118 is connected to the first source/drain of transistor 120, the first source/drain of transistor 122 and the gate of transistor 142. The gates of transistor 138 and 140 are connected to the drain of transistor 140, which is connected to the drain of N-channel transistor 144 and to the first node of a capacitor 146. The gate of transistor 144 is connected to the second node of capacitor 146 and to the drain of P-channel transistor 148 and the source of transistor 134. The drain of transistor 138 is connected to the drain of N-channel transistor 150, and to the first node of a capacitor 152 as well as the second source/drains of transistors 120 and 122. The second node of capacitor 152 is connected to the gate of transistor 150, the source of transistor 130 and the drain of transistor 136. The sources of transistors 150 and 144 are connected to the drain of N-channel transistor 154. The gate of transistor 154 is connected to the gate and drain of N-channel transistor 156 and to the drain of transistor 132. The sources of transistors 136, 156, 154 and 148 are connected to $V_{SS}$. The gate of transistor 148 is connected to the first node of resistors 158 and 160. The second node of resistor 160 is connected to $V_{SS}$, and the second node of resistor 158 is connected to the drain of transistor 142 and to a resistor string comprising resistors 162, 164, 166 and 168. The voltage outputs, of $V_1$-$V_5$ of the regulator circuit 24 are present at nodes 170, 172, 174, 176 and 178, respectively.

In operation, the voltage regulator is an operational amplifier whose output undergoes voltage division and is fed back as the input. The input of the op-amp is tied to a fixed voltage ($2V_{BE}$ from the band-gap voltage reference circuit 22); thus, the output of the regulator tries to mimic the reference voltage. Hence, $$V_{out} = V_{ref} \frac{\text{Resistor 160} + \text{Resistor 158}}{\text{resistor 160}}.$$

The op-amp section is made up of differential pair transistors 144 and 150 and active load transistors 138 and 140. This op-amp sets the gate to source voltage of transistor 142, which in turn, sets the voltage $V_{out}$.

Transistors 136 and 148 boost voltages and $V_{ref}$ and $V_{N4}$, respectively, such that the input differential pair transistors will remain in the correct operating regions. The current through transistors 136 and 148 (source follower transistors) are set by transistors 124 and 130 for transistor 136 and by connected current supplies (transistors 124 and 130 and 128 and 134) have the gate voltages set by the signals $V_{HH}$ and $V_{HL}$, supplied by the band-gap reference. It should be noted again that the band-gap sets these voltages based on the strength of the transistors (process variations) and temperature (which also affects the strength of the transistors); because of this, a consistent current flow may be expected with transistors 136 and 148. The purpose of the combination of the voltage of node N4 higher to a point where the N-channel differential pair 150 and 144 will react to the voltages correctly.

Transistors 126 and 132 are also connected to the signals $V_{HH}$ and $V_{HL}$, respectively. The current conducted by these transistors is mirrored through N-channel transistors 156 and 154, which supply the input differential pair with their maximum current sink potential. Transistors 138 and 140 form an active load for the input differential pair. The overall gain of the op-amp core is less than five in this configuration. Too much gain will excessively change the gate to source voltage ($V_{gs}$) of transistor 142. This will have two effects: (1) the $V_{gs}$ of transistor 142 will reach either rail, where no more adjustments are available, and (2) the overall gain of the regulator will become too high, thereby making it prone to oscillation.

Figure 6:
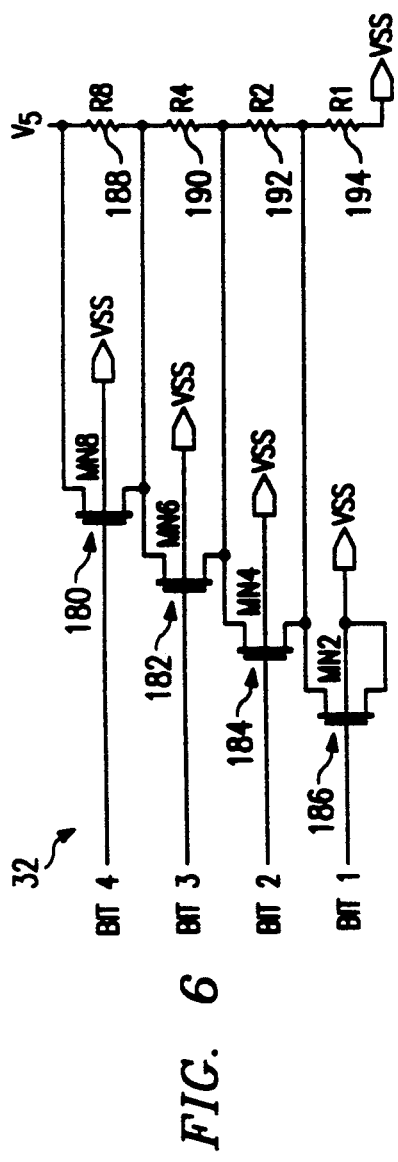
FIG. 6 illustrates a schematic representation of the digital-to-analog converter of FIG. 2.

FIG. 6 illustrates a schematic representation of the DAC 32. The DAC comprises four N-channel transistors 180, 182, 184 and 186. Resistors 188, 190, 192 and 194 are connected in parallel with the source/drain regions of respective N-channel transistors 180–186. The source of transistor 186 and the second node of resistor 194 are connected to $V_{SS}$. The drain of transistor 180 is connected to $V_5$ (see FIG. 5). Bit 1 is connected to the gate of transistor 186, bit 2 is connected to the gate of transistor 184, bit 3 is connected to the gate of transistor 182, and bit 4 is connected to the gate of transistor 180. The DAC 32 provides a variable voltage over the resistor string, comprising resistors 188–194. Any combination of resistors may be shorted out by enabling the respective transistor 180–186. The resistors 188–194 may each be of a different resistive value, thereby providing a very wide range of adjustment from the DAC. Further, this adjustment may be controlled by the digital inputs bits 1–4, allowing microprocessor control of the LCD contrast.

Figure 7:
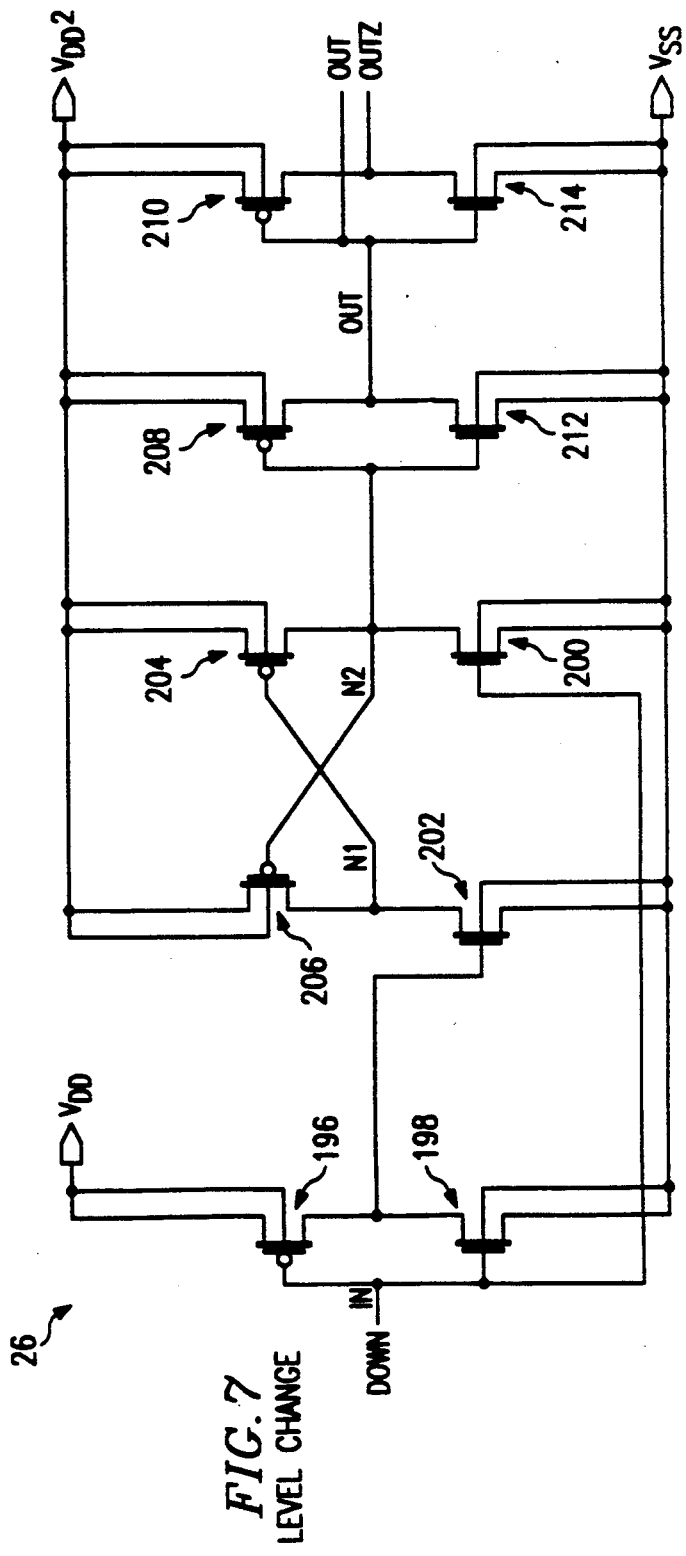
FIG. 7 illustrates a schematic representation of the level chain circuit of FIG. 2.

FIG. 7 illustrates the level change circuitry 26. The level change circuitry 26 comprises P-channel transistor 196 having a source connected to $V_{DD}$, a drain connected to the drain of N-channel transistor 198 and a gate connected to the gates of N-channel transistors 198 and 200. The source of N-channel transistor 198 is connected to $V_{SS}$. The drain of P-channel transistor 196 is also connected to the gate of N-channel transistor 202. N-channel transistor 202 has a drain connected to the gate of P-channel transistor 204 and a drain of P-channel transistor 206. The source of N-channel transistor 202 is connected to $V_{SS}$. The VDD2 is connected to the source of P-channel transistor 206 and the source of P-channel transistors 204, 208 and 210. The gate of P-channel transistor 206 is connected to the drain of P-channel transistor 204 and to the gate of P-channel transistor 208 and N-channel transistor 212. The drain of P-channel transistor 208 is connected to the drain of N-channel transistor 212 and to the gates of P-channel transistor 210 and N-channel transistor 214. The drain of P-channel transistor 210 is connected to the drain of transistor 214. The drain of transistor 212 is connected to the drain of transistor 208. The source of transistors 200, 212 and 214 are connected to $V_{SS}$.

The purpose of the level change circuitry 26 is to change the logic high level from the standard logic (at $V_{CC}$ with a nominal of 5 volts) to circuitry whose supply is $2*V_{DD}$ (with a nominal of 10 volts). Transistors 206 and 204 are crosscoupled and perform the actual level of conversion along with transistors 202 and 200. The input signal DOWN (found on FIG. 2) is sent to N-channel transistor 200 while its inversion is applied to the other N-channel transistor 202. If DOWN is a logic low, then transistor 202 is on, thereby pulling the node N₁ and VDD2 logic level by increasing the gate to source voltage of transistor 204. This signal is then inverted or buffered (for the true and inverted versions of the logic signal respectively) and applied to the functional blocks with the increased supply. Transistors 204, 206, 200 and 202 are sized to provide a zero DC current flow.

The present invention provides several significant advantages over the prior art. The entire circuit, including the multiplexing circuitry and the voltage dividing circuitry, may be included on a single integrated circuit. The integrated circuit is less expensive and the accompanying display is also less expensive, since the number of connections between the display and the driver circuit is reduced. Further, the present invention consumes little power. The regulator itself is very efficient so that is may be used in applications where overall current or power consumption is important, if not critical.

Additionally, the present invention will compensate for changing optical responses of the LCD material over temperature. Since the regulator is dedicated to the LCD display, it may be designed in such a way that its output voltage will change at the same rate as the optical response of the LCD material over the same temperature change. Where adjustment of the LCD contrast is desired, that adjustment may be performed using digital inputs, thereby alleviating the need for variable resistors.

Although the preferred embodiment of the present invention has been described in detail, it should be understood that various changes, substitutions and alternations could be made herein without departing from the spirit and scope of the invention as defined by the appended claims.

What is claimed is:

1. A circuit for generating a plurality of driving voltages for use with a LCD driver circuit comprising:
   a supply voltage source;
   a reference voltage source coupled to said supply voltage source, said reference voltage source being substantially independent of supply voltage source variations and substantially dependent upon temperature variations of a liquid crystal display; and
   a voltage divider circuit for generating said plurality of driving voltages responsive to said reference voltage.

2. The circuit of claim 1 wherein said reference voltage source comprises a band-gap voltage source.

3. The circuit of claim 2 wherein said band-gap voltage source outputs a voltage of 2 $V_{BE}$.

4. A circuit for generating a plurality of driving voltages for use with a LCD driver circuit, comprising:
   a supply voltage source;
   a reference voltage source coupled to said voltage source for outputting a substantially constant reference voltage despite variations in the voltage output from said voltage source wherein said reference voltage source comprises a bond-gap voltage source and said band-gap voltage source outputs a voltage of $2V_{be}$ and is further operable to output a differential voltage between first and second nodes, said differential voltage being substantially constant despite variations in the voltage output from said voltage source; and
   a voltage divider circuit for generating said plurality of driving voltages responsive to said reference voltage.

5. The circuit of claim 1 and further comprising a voltage regulator coupled to said reference voltage source and said voltage divider circuit for providing an output voltage to said divider circuit responsive to the reference circuit.

6. The circuit of claim 1 and further comprising a voltage doubler coupled between said voltage source and said reference voltage source.

7. The circuit of claim 1 wherein said divider circuit comprises a plurality of resistors arranged in series and having a voltage applied across the series such that a plurality of voltages are generated at nodes between said resistors.

8. The circuit of claim 2 wherein said divider circuit further comprises a variable voltage circuit operable to control the amount of voltage across said resistors.

9. The circuit of claim 8 wherein said variable voltage circuit is digitally controlled.

10. The circuit of claim 9 wherein said variable voltage circuit comprises a second plurality of resistors arranged in series and bypass circuitry operable to selectively bypass one or more of the second plurality of resistors responsive to a control signal.

11. The circuit of claim 10 wherein said control signal comprises a plurality of logic signals corresponding to respective of said second plurality of resistors.

12. The circuit of claim 11 wherein said divider circuitry comprises a plurality of MOS transistors having gates coupled to said logic signals and source/drain regions coupled across respective of said second plurality of resistors such that a low impedance path is formed parallel to one or more of the second plurality of resistors responsive to the logic signals.

13. A method of generating a plurality of driving voltages for use with an LCD driver circuit comprising the steps of:
providing a supply voltage;
generating a reference voltage from said supply voltage, said reference voltage being substantially independent of said supply voltage variations and substantially dependent upon temperature variations of a liquid crystal display; and
generating a plurality of driving voltages responsive to the reference voltage.

14. The method of claim 13 wherein said step of generating the reference voltage comprising the step of generating a band-gap voltage.

15. The method of claim 14 wherein said step of generating a band-gap voltage comprises generating a band-gap voltage of $2V_{BE}$.

16. The method of claim 15 and further comprising the step of generating a differential voltage being substantially constant despite variations in the voltage output from the voltage source.

17. The method of claim 13 wherein said step of generating a plurality of driving voltage comprises the step of applying a voltage across a plurality of resistors such that a plurality of voltages are generated at nodes between said resistors.

18. The method of claim 17 and further comprising the step of providing a variable voltage circuit in series with said plurality of resistors such that the amount of voltage across the resistors may be varied.

19. The method of claim 18 wherein the variable voltage circuit is digitally controlled.

* * * * *